(12) United States Patent
Ogi (10) Patent No.: US 7,091,637 B2
(45) Date of Patent: Aug. 15, 2006

(54) AC GENERATOR FOR VEHICLE HAVING RECTIFYING UNIT

(75) Inventor: Hiroyuki Ogi, Komaki (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/736,644

(22) Filed: Dec. 17, 2003

(65) Prior Publication Data

US 2004/0124724 A1 Jul. 1, 2004

(30) Foreign Application Priority Data

Dec. 19, 2002 (JP) ............................. 2002-368284

(51) Int. Cl.
*H02K 7/00* (2006.01)

(52) U.S. Cl. ..................... 310/68 D; 310/64

(58) Field of Classification Search .............. 310/68 D, 310/52–64; 363/141, 144, 145, 125, 126; 322/21, 25, 27, 28, 32, 36, 46, 63, 64
See application file for complete search history.

(56) References Cited

U.S. PATENT DOCUMENTS

| | | | |
|---|---|---|---|
| 3,078,409 A | 2/1963 | Bertsche, Jr. et al. | |
| 3,571,657 A * | 3/1971 | Domann ....................... | 361/21 |
| 3,739,209 A * | 6/1973 | Drabik ......................... | 310/64 |
| 4,383,215 A * | 5/1983 | Frister .......................... | 322/63 |
| 4,554,574 A | 11/1985 | Wright | |
| 5,296,778 A | 3/1994 | Stroud ....................... | 310/68 D |
| 5,424,594 A | 6/1995 | Saito et al. ................ | 310/68 D |
| 5,737,210 A | 4/1998 | Barahia ..................... | 310/68 D |
| 5,892,308 A * | 4/1999 | Abadia et al. ............. | 310/68 D |
| 5,929,611 A * | 7/1999 | Scott et al. .................... | 322/46 |
| 5,949,166 A | 9/1999 | Ooiwa et al. | |
| 6,184,602 B1 * | 2/2001 | Ooiwa et al. ............. | 310/68 D |
| 6,958,557 B1 * | 10/2005 | Shichijyo .................. | 310/68 D |
| 2002/0114177 A1 | 8/2002 | Denardis | |

FOREIGN PATENT DOCUMENTS

| | | |
|---|---|---|
| FR | 2 734 426 A1 | 11/1996 |
| FR | 2 752 110 | 2/1998 |
| GB | 2 057 763 A | 4/1981 |
| JP | A 56-145759 | 11/1981 |
| JP | A 64-8872 | 1/1989 |
| JP | B2 04-24945 | 4/1992 |
| JP | A 04-244770 | 9/1992 |
| JP | 2002-300756 | * 10/2002 |

* cited by examiner

*Primary Examiner*—Dang Le
(74) *Attorney, Agent, or Firm*—Oliff & Berridge, PLC (57) ABSTRACT

An ac generator for a vehicle includes a rotor for providing a magnetic field, a stator having a stator core in which a plurality of phase-windings is mounted to generate electromotive force when the magnetic field is supplied, a rectifying unit which includes positive electrode side rectifying elements and negative electrode side rectifying elements respectively connected to the plurality of phase-windings. One of the positive electrode side rectifying element and negative electrode side rectifying element that is connected to a portion of the phase-windings is constituted of a single element and the remainders are constituted of parallelly connected two elements.

6 Claims, 7 Drawing Sheets

Related Art

AC GENERATOR FOR VEHICLE HAVING RECTIFYING UNIT

CROSS REFERENCE TO RELATED APPLICATION

The present application is based on and claims priority from Japanese Patent Application 2002-368284, filed Dec. 19, 2002, the contents of which are incorporated herein by reference.

BACKGROUND OF THE INVENTION

1. Field of the Invention

The present invention relates to an ac generator for a vehicle to be mounted in a vehicle or the like.

2. Description of the Related Art

An ac generator for a vehicle generates electric power by means of mechanical power that is supplied by an engine so as to charge a battery and supply electric power for engine ignition, illumination and operation of various electrical accessories. It is very important to make such an ac generator more compact, lighter in weight, more powerful and less expensive, in view of market competition.

Recently, various electric accessories have been adopted in order to comply with various laws and regulations and market demand for more sophisticated vehicles. Accordingly, power consumption of the vehicle has increased and heat generation by the ac generator increases, so that temperature of various parts becomes very high. Further, the increase in the various electrical accessories increases the degree of accumulation of the engine compartment, resulting in increasing the temperature of the engine compartment. Thus, it is very important to reduce the temperature of an ac generator.

In particular, temperature of the rectifying unit, which is disposed near other accessories, becomes higher than other accessories because it generates more heat as more current is supplied by the ac generator and because it is affected by heat radiation from other accessories. Therefore, it is the most important to reduce temperature of the rectifying unit.

Recently, a vehicle is equipped with various electronically controlled devices which includes an ECU (engine control unit). In such a vehicle, if a surge voltage is generated by the ac generator due to breakdown of a power line of the ac generator or abrupt shutdown of an electric load, the ECU or other devices may fail. Therefore, it is necessary to suppress such a surge voltage.

The following is disclosed in JP-A-4-244770 (pages 2–3, FIGS. 1–2) as one of conventional ways of cooling a rectifying unit: the negative electrode side heat sink of the rectifying unit is contacted with a generator housing and the positive electrode side heat sink is contacted with metal cover via a insulating member so that the rectifying unit can be cooled by way of heat transfer.

The following is also disclosed in French Laid Open Patent Application 2734426 (FIG. 1) as another way of cooling a rectifying unit: the negative electrode side rectifying element is not fixed to a heat sink but is directly force-fitted to a hole of the housing so as to directly transmit the heat generated by the rectifying element to the housing.

As disclosed in JP-A-64-8872 (Pages 2–3, FIGS. 1–2), it is well known as a conventional art of suppressing surge voltage that all the rectifying elements are zener diodes. Further, there is a rectifying unit, as disclosed in JP-B2-4-24945 (page 2, FIGS. 1–3), in which the zener diodes are used in one group of the positive electrode side rectifying elements or the negative electrode side rectifying elements and normal diodes are used in the other group.

The rectifying unit of an ac generator for a vehicle disclosed in JP-A-4-244770 has an aim of cooling the rectifying unit by heat transfer from the heat sink to the housing or the metal cover. However, the temperature of the housing becomes very high because the housing encloses a stator core the temperature of which is the highest in the ac generator. Therefore, the heat transfer from the negative electrode side heat sink is not effectively carried out. In other words, a sufficient cooling effect can not be achieved.

The rectifying unit disclosed in French Laid Open Patent Application 2734426 has an aim of providing highly efficient heat transfer for better cooling effect by direct force-fit into the housing. However, a sufficient cooling effect can not be provided because the temperature of the housing becomes very high, as stated above. The positive electrode side heat sink does not particularly increase the cooling effect, resulting in insufficient cooling.

It is well known to use zener diodes for all the rectifying elements in order to suppress the surge voltage. In fact, the zener diodes have been widely utilized for that purpose. However, the zener diode is more expensive than the normal diode, resulting in increase in the cost of the ac generator. The rectifying unit disclosed in JP-A-64-8872 includes normal diodes for the positive electrode side rectifying element and zener diodes for the negative electrode side rectifying elements. In this rectifying unit, a high backward voltage may be applied to the normal diodes, so that a surge voltage may go out of an ac generator to an electronic device such as an ECU, which may be badly affected.

The rectifying unit disclosed in JP-B2-4-24945 has much more rectifying elements, and it is difficult to reduce the size and weight of an ac generator for a vehicle and the production cost thereof.

SUMMARY OF THE INVENTION

The present invention has been made in view of the above problems and has an object of providing an ac generator for a vehicle which can reduce the temperature rise of the rectifying unit and production cost and suppress a surge voltage.

In order to attain the above described subjects, an ac generator for a vehicle includes a rotor for providing a rotating magnetic field, a stator disposed around said rotor and having a stator core in which a plurality of phase-windings is mounted to generate electromotive force when the rotating magnetic field is supplied, a rectifying unit formed by a bridge circuit which includes a plurality of pairs of a positive electrode side rectifying element and a negative side rectifying element respectively connected to the plurality of phase-windings. It is characterized in that one of the pairs of the positive electrode side rectifying element and negative electrode side rectifying element that is connected to at least a portion of the plurality of phase-windings is constituted of a single diode and the remainder is constituted of parallelly connected two diodes. Because one of the positive electrode side rectifying element and the negative electrode side rectifying element is constituted of parallelly connected two elements that corresponds to each phase-winding, particularly phase-current passing through a diode that is disposed at a portion whose temperature is very high is shared by two elements to suppress temperature rise thereof. Because the heat generating elements can be separately disposed on the heat sink of the rectifying unit, the temperature rise of the rectifying unit can be reduced.

It is preferable that the above described diodes that constitute the positive electrode side rectifying elements and the negative electrode side rectifying elements are zener diodes. Because the zener diode timely breaks down when a surge voltage is generated in the phase winding, surge voltage emission from the ac generator may be prevented. Further, parallelly connected zener diodes are used for only a portion of the rectifying elements of the rectifying unit, the production cost can be made comparatively less.

It is preferable that one of the parallelly connected two elements is a zener diode and the other is a normal diode. If a surge voltage is generated in a phase winding, the zener diode timely breaks down, so that a surge voltage emission from the ac generator can be prevented. Use of the normal diode can reduce the production cost.

It is preferable that each of the parallelly connected two elements has a smaller current capacity than other elements, because such elements are less expensive than other elements of a normal current capacity.

It is also preferable that a positive electrode side heat sink to which the positive electrode side rectifying elements are fixed and a negative electrode side heat sink to which the negative electrode side rectifying elements are fixed are disposed in two planes that are perpendicular to a rotation axis of said rotor, and that one of the positive electrode side heat sink and the negative electrode side heat sink that is larger in outside diameter than the other is constituted of a plurality of separate heat sinks. The above arrangement increases the yield ratio of heat sink material, thereby reducing the material cost.

It is preferable that the parallelly connected two elements are respectively fixed to each of the plurality of separate heat sinks. This arrangement can uniformly reduce the temperature of the respective heat sinks and prevent the local temperature rise of the rectifying unit from becoming very high. If three phase-windings are used in the ac generator, the parallelly connected two elements are used to correspond to one of the phase-windings, and four elements are used as the positive electrode side rectifying elements or negative electrode side rectifying elements. In this case, the same number of elements can be allocated to each separate heat sink, so that difference in temperature between the separate heat sinks is small.

BRIEF DESCRIPTION OF THE DRAWINGS

Other objects, features and characteristics of the present invention as well as the functions of related parts of the present invention will become clear from a study of the following detailed description, the appended claims and the drawings. In the drawings:

DETAILED DESCRIPTION OF THE PREFERRED EMBODIMENTS

An ac generator for a vehicle according to a preferred embodiment of the invention will be described with reference to the appended drawings.

Figure 1:
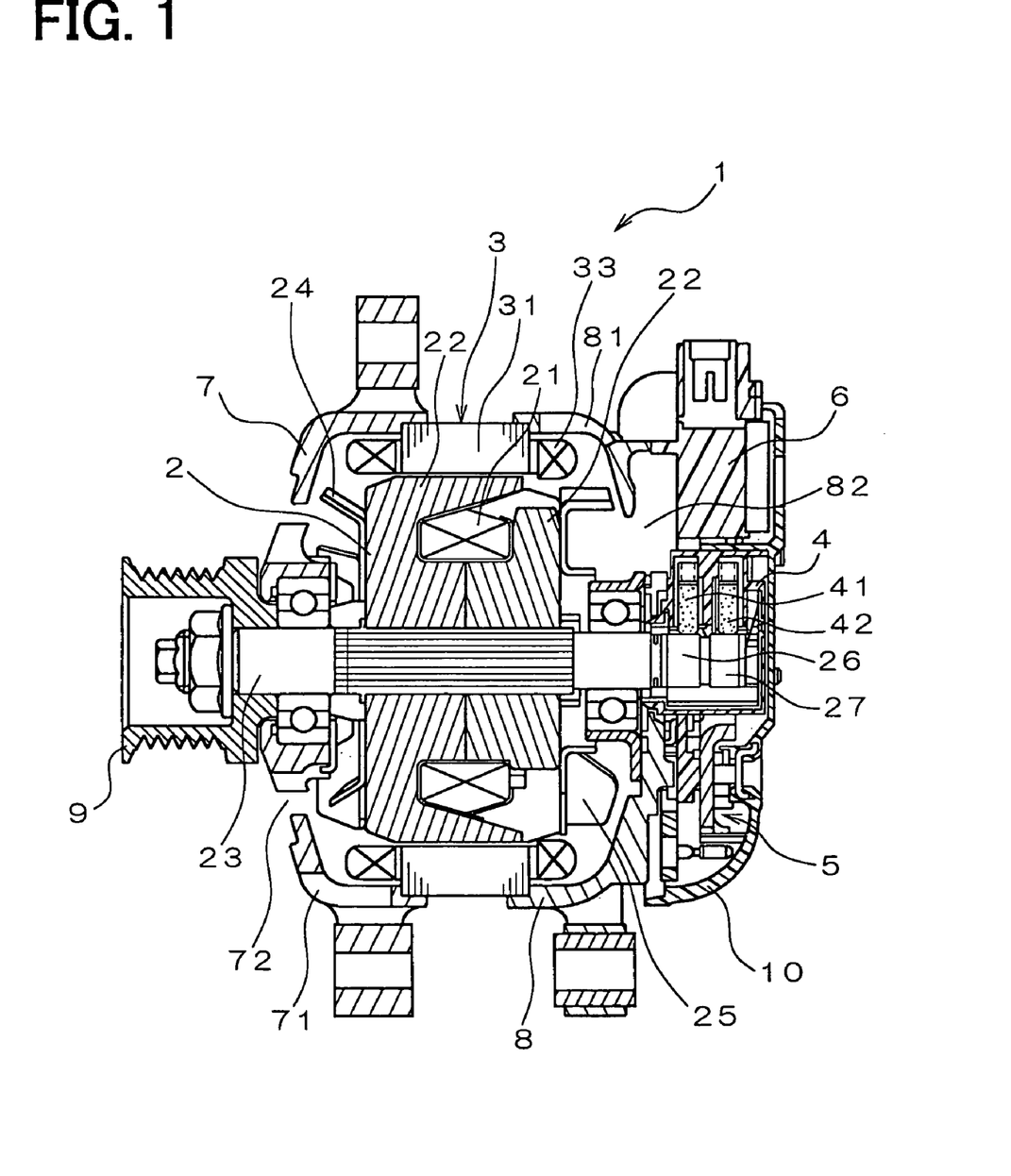
FIG. 1 is a cross-sectional view of an entire body of the ac generator for a vehicle according to the embodiment of the invention.

FIG. 1 is a cross-sectional view of an entire body of the ac generator for a vehicle according to the preferred embodiment of the invention, which has an internal cooling fan. As shown in FIG. 1, the vehicle ac generator 1 includes a rotor 2, a stator 3, a brush unit 4, a rectifying unit 5, an IC regulator 6, a drive frame 7, a rear frame 8, a pulley 9, a rear cover 10, etc.

The rotor 2 has a field coil 21 of a cylindrically wound insulated copper wire and a pair of pole cores 22 each of which is fixed together by a rotary shaft 23 to sandwich the field coil and has six claw poles surrounding the field coil 21. An axial flow type cooling fan 24, which takes in air from a front portion of the ac generator and sends out the air in axial and radial directions, is fixed by welding or the like to the front one of the pole cores 22 at its front end. In a similar manner, a centrifugal type cooling fan, which takes in air from a rear portion of the ac generator and sends the air in radial directions, is fixed to the rear one of the pole cores 22 at its rear end.

The stator 3 includes a stator core 31 and a three-phase stator winding 33 that is constituted of a plurality of phase-windings mounted in a plurality of slots formed in the stator core 31 at prescribed winding pitches.

The brush unit 4, which is to supply field exciting current from the rectifying unit 5 to the field coil 21, includes a pair of slip rings 26, 27 formed on the rotary shaft 23 and a pair of brushes 41, 42 respectively pressing against the slip rings 26, 27.

The rectifying unit 5 converts three-phase alternating output voltage of the three-phase stator winding 33 into direct current voltage. The detailed structure of the rectifying unit 5 and connection with the stator winding 33 will be described later.

The IC regulator 6 controls field exciting current to be supplied to the field coil 21 of the rotor 2 so as to regulate the output voltage of the vehicle ac generator 1.

The drive frame 7 and the rear frame 8 accommodate the rotor 2 and the stator 3 and support the rotor 2 and the stator 3 so that the rotor 2 can rotate about the rotary shaft 23 and so that a prescribed air gap can be formed between the circumference of the pole cores 22 of the rotor 2 and stator core 3. The drive frame 7 has a plurality of air discharge windows 71 at portions thereof opposite the front portion of the stator winding 33 that projects from the axial end of the stator core 31 and a plurality of air intake windows 72 at an axial end thereof. Similarly, the rear frame 8 has a plurality of air discharge windows 81 at portions thereof opposite the rear portion of the stator winding 33 that projects from the axial end of the stator core 31 and a plurality of air intake windows 82 at an axial end thereof.

The rear cover 10 covers and protects the brush unit 4, the rectifying unit 5 and the IC regulator 6.

Figure 2:
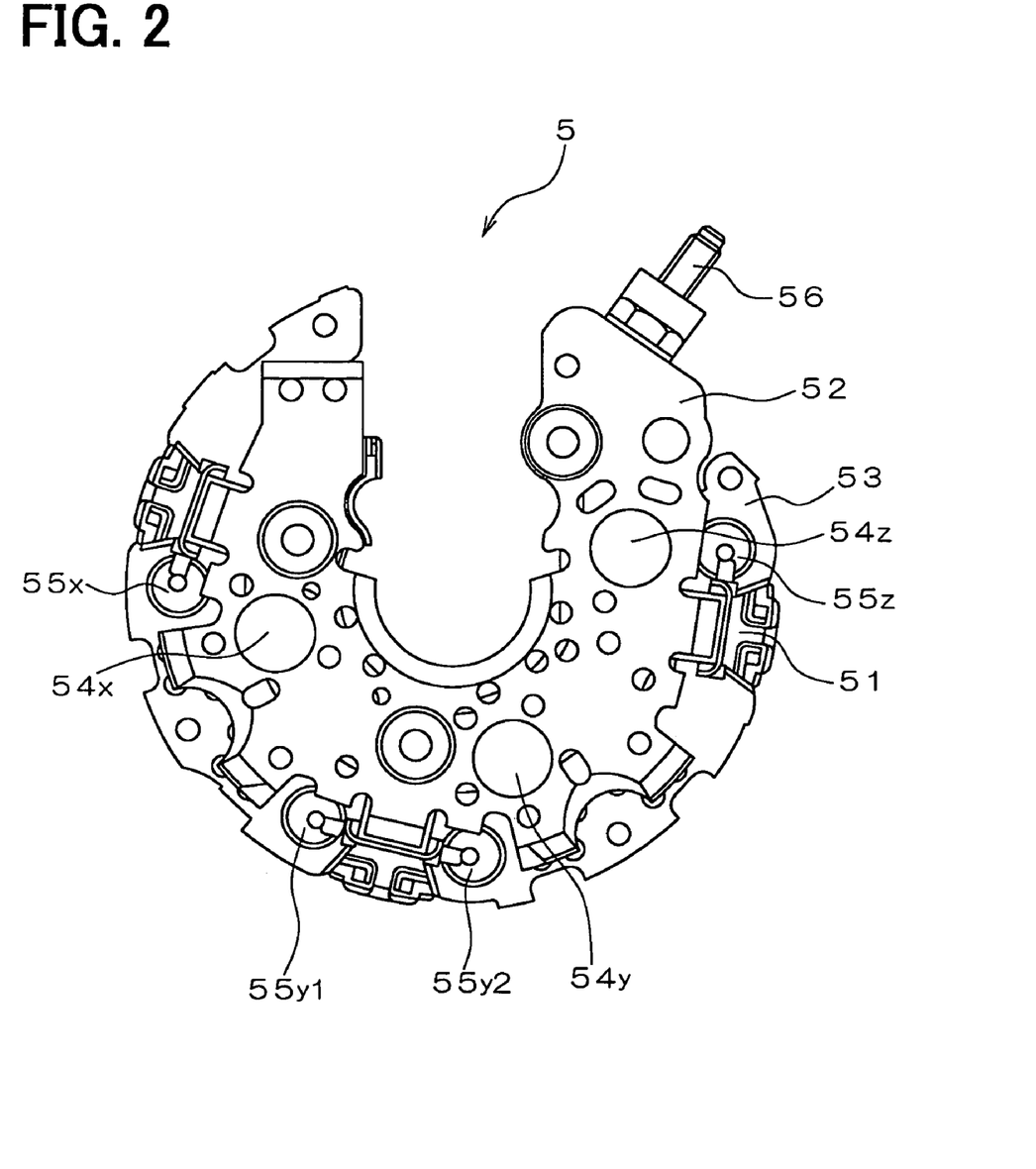
FIG. 2 is a plan view showing details of a rectifying unit.
Figure 3:
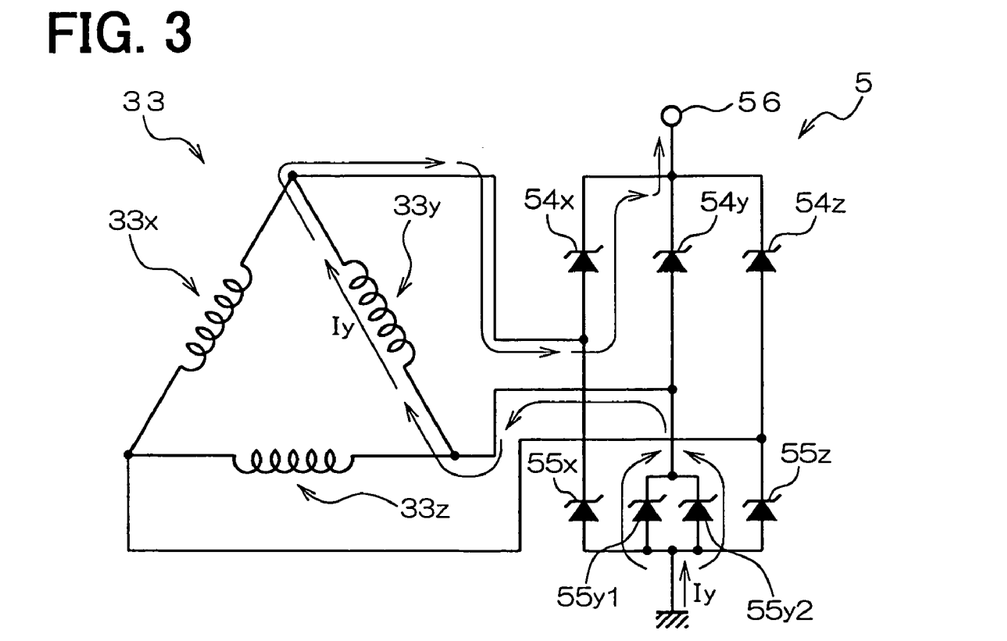
FIG. 3 is a circuit diagram of the rectifying unit.

The details of the rectifying unit 5 will be described next. FIG. 2 is a plan view showing the rectifying unit 5 in detail. FIG. 3 is a circuit diagram of the rectifying unit 5 with the stator winding 33.

As shown in FIG. 2, the rectifying unit 5 of the embodiment of the invention includes a terminal member 51 which includes a wiring electrode, a pair of a positive electrode side heat sink 53 and a negative electrode side heat sink 53 which are disposed at a prescribed distance from each other, a plurality of positive and negative electrode side rectifying elements 54, 55 which are respectively force-fitted to the corresponding heat sinks and an output terminal 56 which is fixed to the positive electrode side heat sink 52.

As shown in FIG. 3, the stator 33 is constituted of Δ-connected three (X, Y, Z) phase-windings 33x, 33y, 33z, and a bridge circuit formed from the positive electrode side rectifying elements 54 and the negative electrode side rectifying elements 55 is connected to each junction of the phase-windings 33x, 33y, 33z.

That is: the junction of the phase-winding 33x and the phase winding 33y is connected to a junction of the anode of a positive electrode side diode 54x and the cathode of a negative electrode side diode 55x; the junction of the phase-winding 33y and the phase winding 33z is connected to a junction of the anode of a positive electrode side diode 54y and the cathode of negative electrode side diodes 55y1, 55y2; and the junction of the phase-winding 33z and the phase winding 33x is connected to a junction of the anode of a positive electrode side diode 54z and the cathode of a negative electrode side diode 55z. All the cathodes of the positive electrode side diodes 54x, 54y, 54z are connected together via the positive electrode side heat sink 52, and the output terminal 56 of the ac generator 1 is also connected to the positive electrode side heat sink 52. All the anodes of the four negative electrode side diodes 55x, 55y1, 55y2, 55z are also connected together via the negative electrode side heat sink 53, which is electrically connected to the rear frame 8.

In the above-described preferred embodiment, zener diodes are used for all the positive electrode side rectifying elements 54 and the negative electrode side rectifying elements 55.

As described above, the rectifying unit 5 of the preferred embodiment of the invention includes positive electrode side rectifying elements 54 and negative electrode side rectifying elements 55 that correspond to the three phase-windings 33x, 33y, 33z and form a bridge circuit. Two negative electrode side diodes 55y1, 55y2 are used for at least a portion of the three phase-windings 33x, 33y, 33z (e.g. phase-windings 33x, 33y in FIG. 3).

A positive-electrode side half wave rectifying circuit is formed by three positive electrode side diodes 54x, 54y, 54z. When positive voltage is generated in the phase-windings 33x, 33y, 33z, these three positive electrode side diodes 54x, 54y, 54z pass current flowing through a corresponding one of the positive electrode side rectifying elements 54 toward the positive electrode side heat sink 52.

A negative electrode side half wave rectifying circuit is formed by four negative electrode side diodes 55x, 55y1, 55y2, 55z. When positive voltage is generated in the phase-windings 33x, 33y, 33z, these negative electrode side diodes 55x, 55y1, 55y2, 55z pass current flowing toward a corresponding one of the negative electrode side rectifying elements 55 from the negative electrode side heat sink 53. The amount Iy of the current flowing into the phase-winding 33y is divided by the parallelly connected two negative electrode side diodes 55y1, 55y2 into Iy/2.

Figure 5:
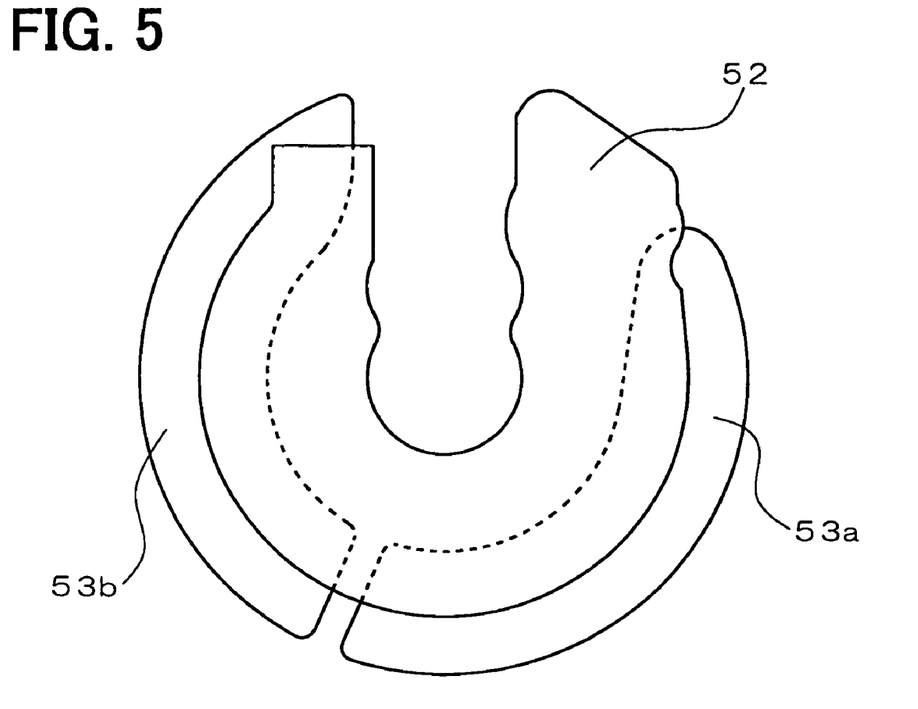
FIG. 5 is a schematic diagram illustrating layout of the heatsinks of the rectifying unit.
Figure 6:
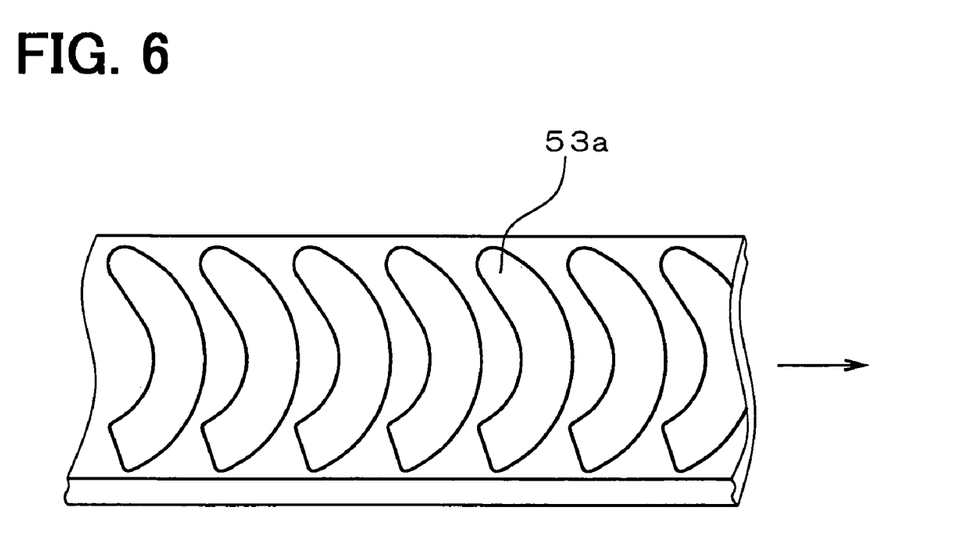
FIG. 6 illustrates a way of cutting plates for heat sinks.

The positive electrode side heat sink 52 and the negative electrode side heat sink 53 are disposed perpendicular to the rotating axis of the rotor 2 to form double layers of planes. The negative electrode side heat sink 53, which is disposed deeper in the rear cover 10, has a larger outside diameter than the positive electrode side heat sink 52 in order to effectively utilize cooling air that is taken from an axially outside portion of the rear cover 10. Because the material yield ratio becomes lower as the outside diameter of the heat sink becomes larger, the negative electrode side heat sink 53 is formed from two sub-heatsinks 53a, 53b, as shown in FIG. 5. This improves the yield ratio, as shown in FIG. 6, so as to reduce the material cost.

One of the negative electrode side diodes 55y1, 55y2 is allocated to each of the above sub-heatsinks 53a, 53b.

Figure 11:
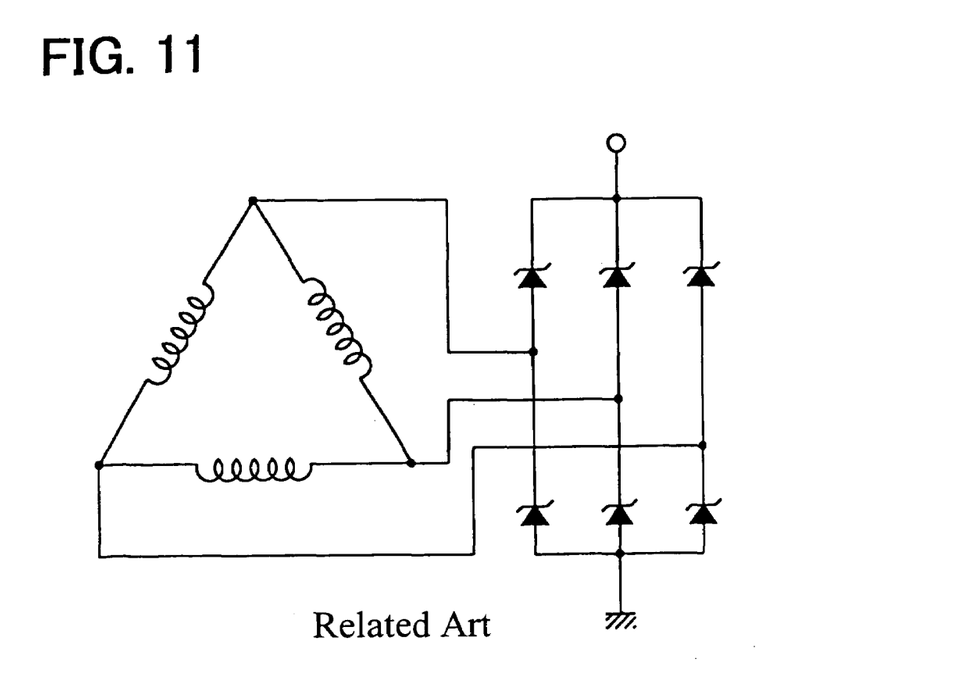
FIG. 11 is a circuit diagram of a rectifying unit of a conventional ac generator for a vehicle.

In general, the ac generator for a vehicle generates three-phase electric power and has a three-phase full-wave rectifying unit, as shown in FIG. 11. A pair of positive electrode side and negative electrode side rectifying elements is used for each phase-winding of the stator winding.

If the negative electrode side sub-heatsinks 53a, 53b are adopted to the rectifying unit shown in FIG. 11, some portion thereof may become high temperature because each of the negative electrode side sub-heatsinks 53a, 53b has to have different number of negative electrode side rectifying elements. On the other hand, the rectifying unit shown in FIG. 3 may not have the above problem because the phase current can be divided by the two negative electrode side diodes 55y1 and 55y2, which generate less heat. Further, because each of the negative electrode side diodes 55y1, 55y2 is allocated to one of the sub-heatsinks 53a, 53b, local temperature rise can be moderated. Accordingly, the temperature of the entire portions of the rectifying unit 5 can be uniformly reduced.

Figure 4:
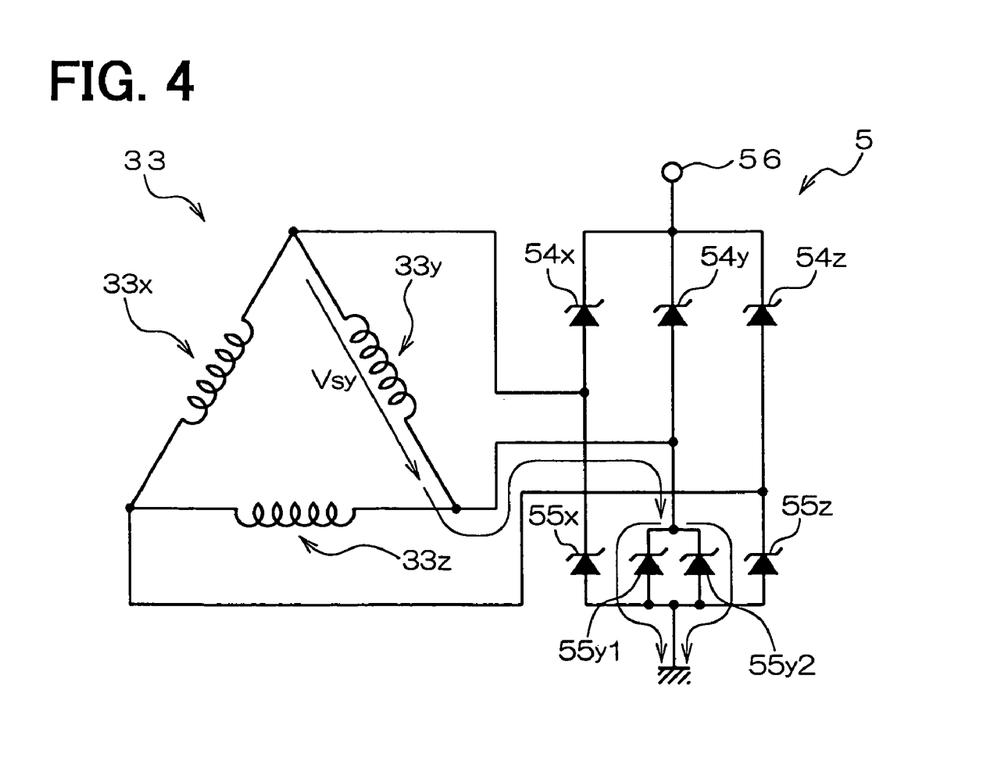
FIG. 4 illustrates operation of the rectifying unit when a surge voltage is applied to the parallelly connected two diode.

FIG. 4 illustrates operation of the rectifying unit 5 when a surge voltage is applied to the parallelly connected two diodes 55y1, 55y2. As shown in FIG. 4, if the phase voltage Vsy of the phase-winding 33y increases due to disconnection of an output power line of the vehicle ac generator 1 or shutdown of an electric load, the negative electrode side diodes 55y1, 55y2 timely breaks down. Therefore, the voltage of the output terminal 56 is prevented from further rising, so that a surge voltage emission can be prevented.

Thus, the rectifying unit 5 of the vehicle ac generator 1 according to the embodiment of the invention adopts parallelly connected two diodes as one of a pair of the positive electrode side rectifying element 54 and the negative electrode side rectifying element 55. Because the phase current is divided to suppress heat generation of the rectifying elements that are disposed at a portion where temperature is much higher than others, and because the heat generating rectifying elements are allocated to the heat sinks 52, 53, the temperature of the rectifying unit 5 can be reduced.

Because zener diodes timely break down when a surge voltage is generated in any one of the phase-windings 33x, 33y, 33z, no surge voltage goes outside from the vehicle ac generator 1.

The capacity, shape or heat sink of the parallelly connected diodes can be changed as far as the diodes are connected in parallel.

Figure 7:
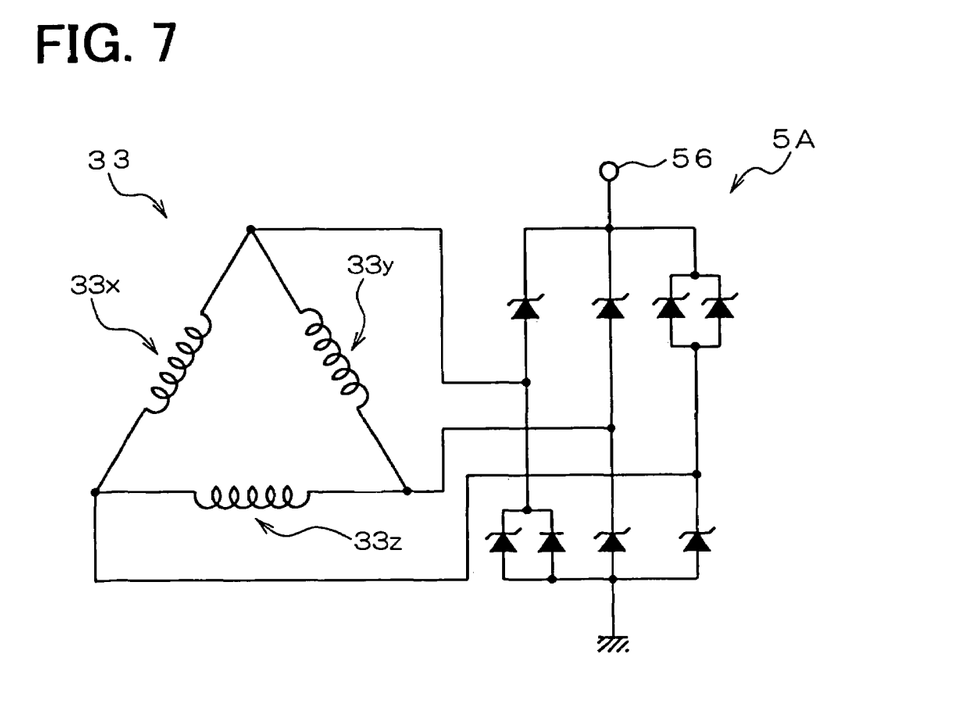
FIG. 7 is a circuit diagram of a modified rectifying unit which has parallelly connected diodes connected to a position different from the previous embodiment.
Figure 8:
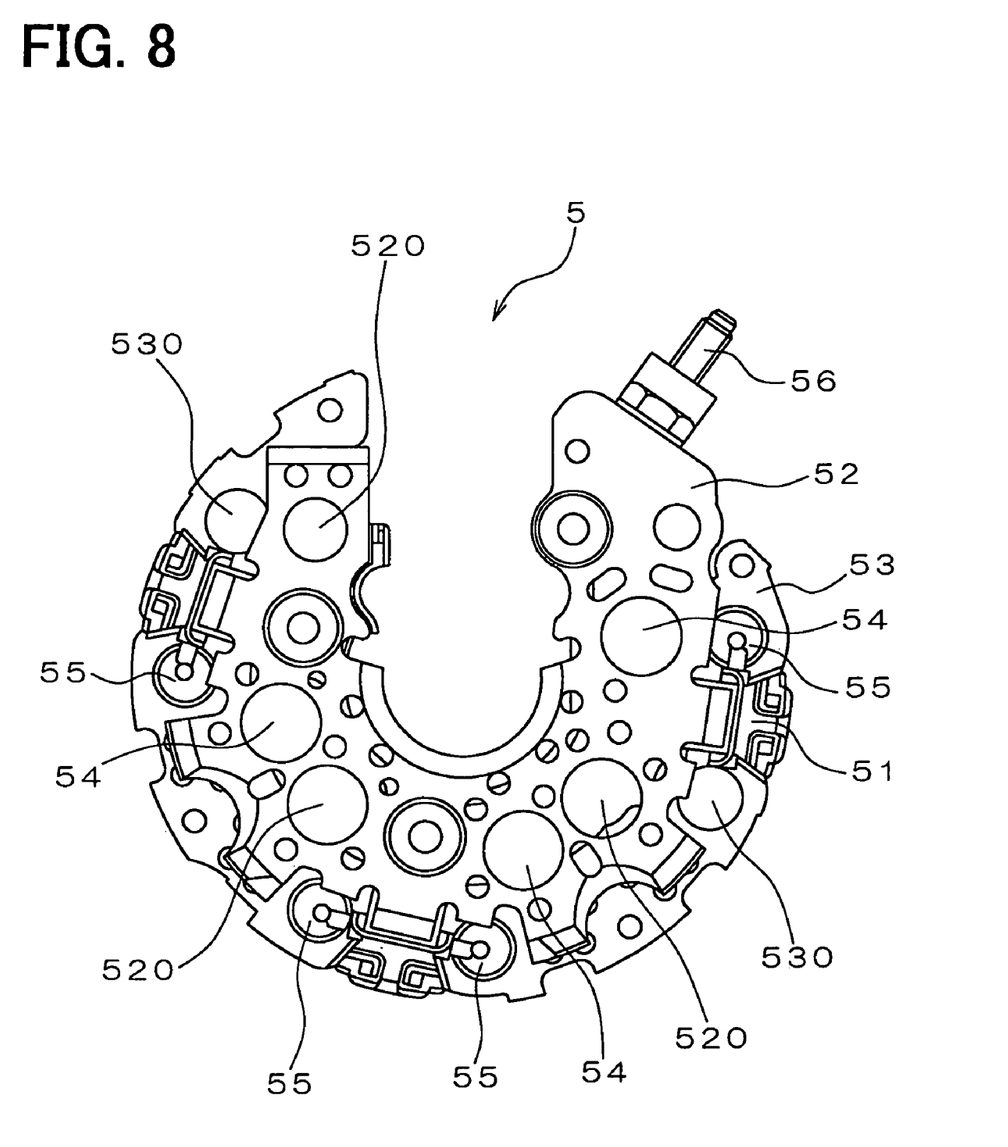
FIG. 8 is a plan view of a modified rectifying unit in which the parallelly connected diodes can be connected to a different position.

FIG. 7 is a circuit diagram of a rectifying unit in which parallelly connected two diodes are disposed at a different portion thereof. The rectifying unit 5A shown in FIG. 7 employs parallelly connected zener diodes for both the positive electrode side circuit of the Z-phase-winding and the negative electrode side X-phase-winding. Thus, the parallelly connected diodes are used for all the circuit except the Y-phase negative electrode side circuit, so that the temperature of portions, where the temperature of the positive electrode side heat sink 52 and the negative electrode side heat sink 53 becomes high due to environmental condition of the vehicle ac generator, can be controlled to be low. As shown in FIG. 8, diode-holes 520, 530 are formed in the heat sinks 52, 53 so that the parallelly connected diodes can be selectively force-fitted.

Figure 9:
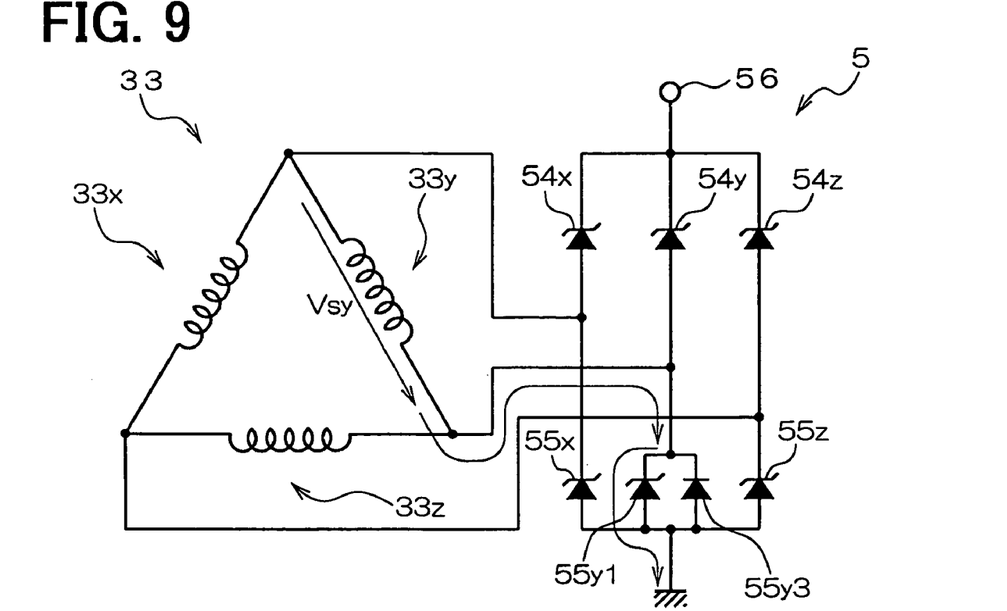
FIG. 9 is a circuit diagram illustrating operation of the rectifying unit having a zener diode for one of the parallelly connected diodes when surge voltage is applied to the rectifying unit.

In the above described embodiment, zener diodes are used for all the rectifying elements. However, it is possible to use a normal diode for one of the parallelly connected diodes 55y3 and a zener diode for the other 55y1, as shown in FIG. 9. The zener diode 55y3 breaks down to prevent a surge voltage from going out whenever a surge voltage is generated. Therefore, the rectifying unit that employs a normal diode can be made less expensive.

It is also possible to use normal diodes for all the rectifying elements. This arrangement can reduce temperature and production cost.

The parallelly connected rectifying elements divide current into two halves, so that the capacity of the diodes can be made smaller than other diodes. That is, the capacity of the element is made smaller than others, which results in cost reduction.

Figure 10:
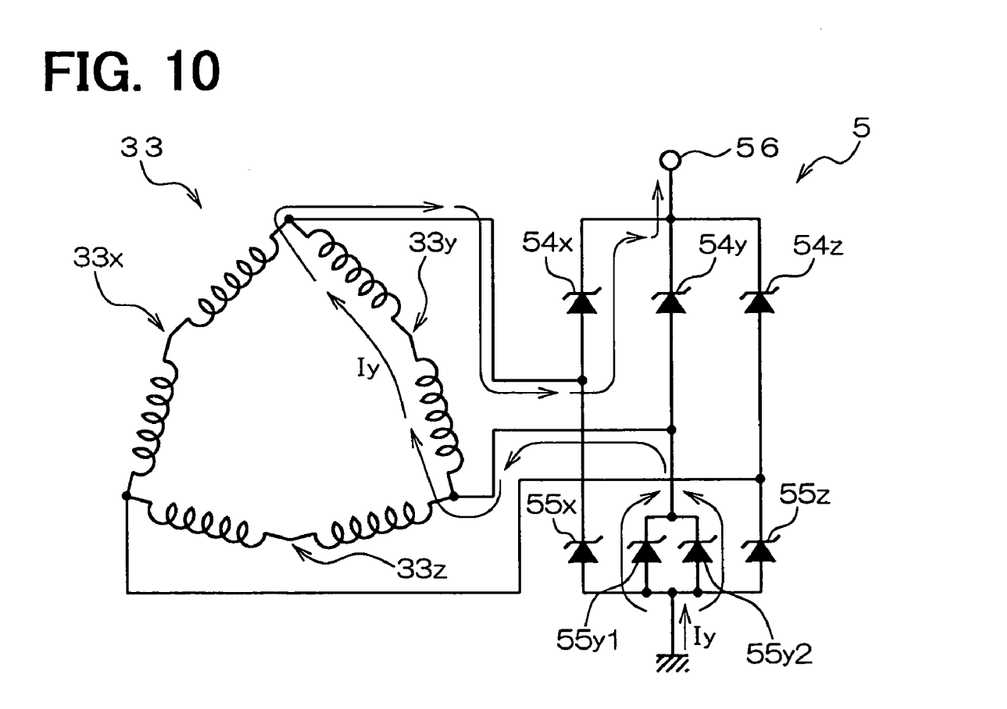
FIG. 10 is a circuit diagram of a modified stator winding.

The Δ-connected stator winding 33 of the above described embodiment can be substituted by a star-connected stator winding. It is also possible, as shown in FIG. 10, to form a modified Δ-connected or star-connected stator winding which is composed of phase-windings of series-connected coils which are slightly different in phase from each other. This arrangement can reduce noises due to magnetic pulsation.

In the foregoing description of the present invention, the invention has been disclosed with reference to specific embodiments thereof. It will, however, be evident that various modifications and changes may be made to the specific embodiments of the present invention without departing from the scope of the invention as set forth in the appended claims. Accordingly, the description of the present invention is to be regarded in an illustrative, rather than a restrictive, sense.

What is claimed is:

1. An ac generator for a vehicle, comprising:
   a housing including a drive frame, a rear frame and a rear cover;
   a rotor, supported by said housing, for providing a magnetic field;
   a cooling fan fixed to said rotor for taking cooling air from outside of the rear cover;
   a stator, supported by said housing and disposed around said rotor, said stator having a stator core in which a plurality of phase-windings is mounted to generate multi-phase electromotive forces when the magnetic field is supplied; and
   a multi-phase full-wave rectifying unit disposed in the rear cover and formed by a bridge circuit which includes a plurality of input terminals respectively connected to the plurality of phase-windings, a positive output terminal, a negative output terminal, positive electrode side rectifying elements having one ends respectively connected to the input terminals and the other ends connected to the positive output terminal, negative electrode side rectifying elements having one ends respectively connected to the input terminals and the other ends connected to the negative output terminal, a semicircular positive electrode side heat sink to which the positive electrode side rectifying elements are fixed and a semicircular negative electrode side heat sink to which the negative electrode side rectifying elements are fixed, said positive electrode side heat sink and said negative electrode side heat sink being respectively disposed in two planes that are perpendicular to a rotation axis of said rotor,
   wherein said negative electrode side heat sink comprises a pair of separate semicircular plates that have a larger outside diameter than the positive electrode side heat sink to utilize cooling air taken by said cooling fan from outside of the rear cover, and
   wherein one of the negative electrode side rectifying elements is constituted of parallelly connected two elements that are respectively fixed to the semicircular plates to equally divide current flowing through one of the input terminals.

2. The ac generator for a vehicle according to claim 1, wherein the elements constituting the positive electrode side rectifying elements and the negative electrode side rectifying elements are zener diodes.

3. The ac generator for a vehicle according to claim 1, wherein one of said parallelly connected two elements is a zener diode and the other is a normal diode.

4. The ac generator for a vehicle according to claim 1, wherein the negative electrode side heat sink is disposed deeper in the rear cover than the positive electrode side heat sink.

5. An ac generator for a vehicle, comprising:
   a housing;
   a rotor for providing a magnetic field;
   a stator, having a stator core supported by said housing and a plurality of phase-windings; and
   a multi-phase full-wave rectifying unit including a bridge circuit of positive electrode side rectifying elements and a negative electrode side rectifying elements, a semicircular positive electrode side heat sink to which the positive electrode side rectifying elements are fixed at one ends thereof, a semicircular negative electrode side heat sink to which the negative electrode side rectifying elements are fixed at one ends thereof, a plurality of input terminals connected to the positive electrode side rectifying elements at the other ends thereof and the negative electrode side rectifying elements at the other ends thereof, a positive output terminal connected to the positive electrode side heat sink, and a negative output terminal connected to the negative electrode side heat sink,
   wherein said negative electrode side heat sink comprises a pair of separate semicircular plates that have a larger outside diameter than the positive electrode side heat sink, and
   wherein one of the negative electrode side rectifying elements is constituted of parallelly connected two elements each of which has as a smaller capacity than other elements and is fixed to different one of the semicircular plates to equally divide current flowing through one of the input terminals.

6. An ac generator for a vehicle, comprising:
   a housing;
   a rotor, supported by said housing, for providing a magnetic field;
   a stator, having a stator core and a plurality of phase-windings to generate a plurality of phase current when the magnetic field is supplied; and a multi-phase full-wave rectifying unit including a plurality of series circuits of a positive electrode side rectifying element and a negative electrode side rectifying element, a semicircular positive electrode side heat sink to which the positive electrode side rectifying elements are fixed at one ends of the series circuits and a semicircular negative electrode side heat sink to which the negative electrode side rectifying elements are fixed at the other ends of the series circuits, a plurality of input terminals each of which is connected to one of the plurality of phase-windings and to a junction of the series circuits of the positive electrode side rectifying element and the negative electrode side rectifying element, a positive output terminal connected to the positive electrode side heat sink, a negative output terminal connected to the negative electrode side heat sink, wherein said negative electrode side heat sink comprises a pair of separate semicircular plates that have a larger outside diameter than the positive electrode side heat sink, and wherein one of the negative electrode side rectifying elements is constituted of parallelly connected two elements one of which is a zener diode fixed to one of the semicircular plates, and the other of the two elements is fixed to the other of the semicircular plates to equally divide one of the phase currents flowing therethrough.

* * * * *